United States Patent [19]
Kim et al.

[11] Patent Number: 6,066,180
[45] Date of Patent: *May 23, 2000

[54] AUTOMATIC GENERATION OF PHASE SHIFT MASKS USING NET COLORING

[75] Inventors: Young O. Kim, San Jose, Calif.; Mark A. Lavin, Katonah; Lars W. Liebmann, Poughquag, both of N.Y.; Glenwood S. Weinert, San Jose, Calif.

[73] Assignee: International Business Machines Corporation, Armonk, N.Y.

[*] Notice: This patent is subject to a terminal disclaimer.

[21] Appl. No.: 09/268,414

[22] Filed: Mar. 15, 1999

Related U.S. Application Data

[63] Continuation of application No. 08/810,844, Mar. 4, 1997, Pat. No. 5,883,813.

[51] Int. Cl.$^7$ .............................. G06F 17/50; G06K 9/00

[52] U.S. Cl. .................................. 716/19; 716/11; 716/4; 378/35; 382/144

[58] Field of Search ...................................... 364/488–491, 364/468–78; 378/34–35; 382/144; 395/500.02–500.22; 716/1–21

[56] References Cited

U.S. PATENT DOCUMENTS

| | | | |
|---|---|---|---|
| 5,270,796 | 12/1993 | Tokui et al. | 356/394 |
| 5,432,044 | 7/1995 | Shimizu | 430/269 |
| 5,441,834 | 8/1995 | Takekuma | 430/5 |
| 5,442,714 | 8/1995 | Iguchi | 382/144 |
| 5,468,578 | 11/1995 | Rolfson | 430/5 |
| 5,481,473 | 1/1996 | Kim et al. | 395/500.06 |
| 5,487,962 | 1/1996 | Rolfson | 430/5 |
| 5,497,334 | 3/1996 | Russell et al. | 395/500.06 |
| 5,519,628 | 5/1996 | Russell et al. | 395/500.11 |
| 5,537,648 | 7/1996 | Liebmann et al. | 395/500.02 |
| 5,883,813 | 3/1999 | Kim et al. | 395/500.2 |

OTHER PUBLICATIONS

Pati et al. ("Phase–shifting masks for microlithography: automated design and mask requirements", Journal of the Optical Society of America, vol. 11, No. 9, Sep. 1994, pp. 2438–2452).

Liu et al. ("Systematic design of phase–shifting masks with extended depth of focus and/or shifted focus plane", IEEE Transactions on Semiconductor Manufacturing, vol. 6, No. 1, Feb. 1993, pp. 1–21).

Microlithography World, Marc D. Levenson, Phase–Shifting Mask Strategies: Isolated Dark Lines, Mar./ Apr. 1992, pp. 6–12.

*Primary Examiner*—Paul R. Lintz
*Assistant Examiner*—Phallaka Kik
*Attorney, Agent, or Firm*—Schmeiser, Olsen & Watts; H. Daniel Schnurmann

[57] ABSTRACT

According to the preferred embodiment, a method is provided for automatically coloring VLSI design elements for the purpose of assigning binary properties to the elements. The preferred method is particularly applicable for use generating phase shift mask designs from VLSI CAD datasets. The preferred method uses net coloring to automatically generate a data set of colored elements. The preferred method is not dependent on the order in which the elements are operated upon. The preferred method has the additional advantage of being able to automatically detect conflicts that prevent the VLSI design from being optimally colored. The preferred method is equally applicable to hierarchical VLSI databases with nested components and traditional flat databases. When applied the hierarchical databases, the preferred method provides element coloring with minimal data flattening required.

26 Claims, 12 Drawing Sheets

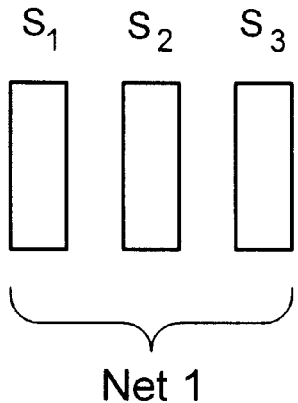
FIG. 2
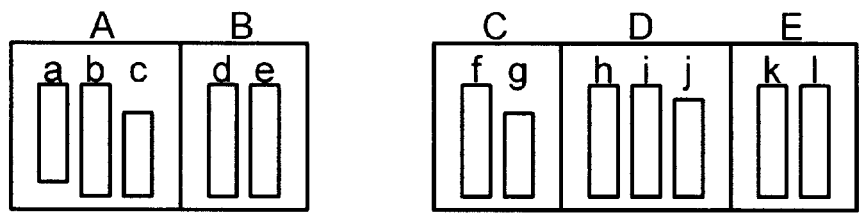
FIG. 3
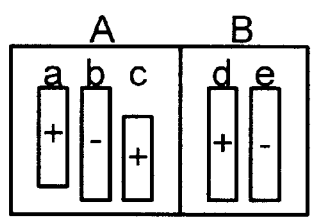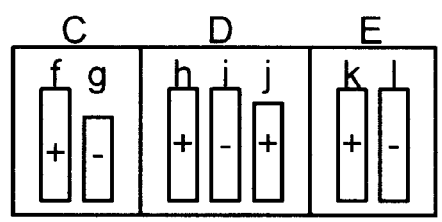
FIG. 4

Net6 = Net1/Net2'   Net8 = Net7/Net5' = Net3/Net4/Net5'

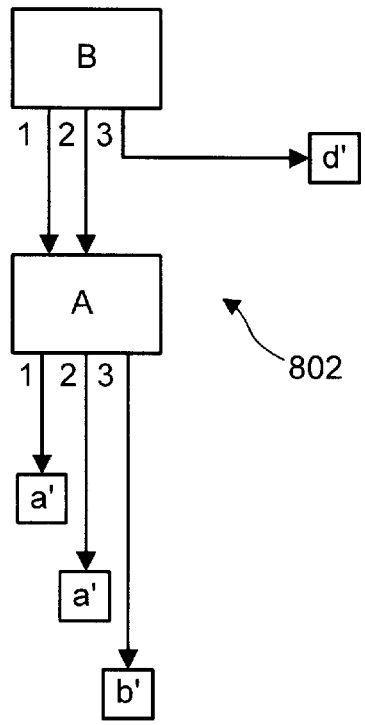
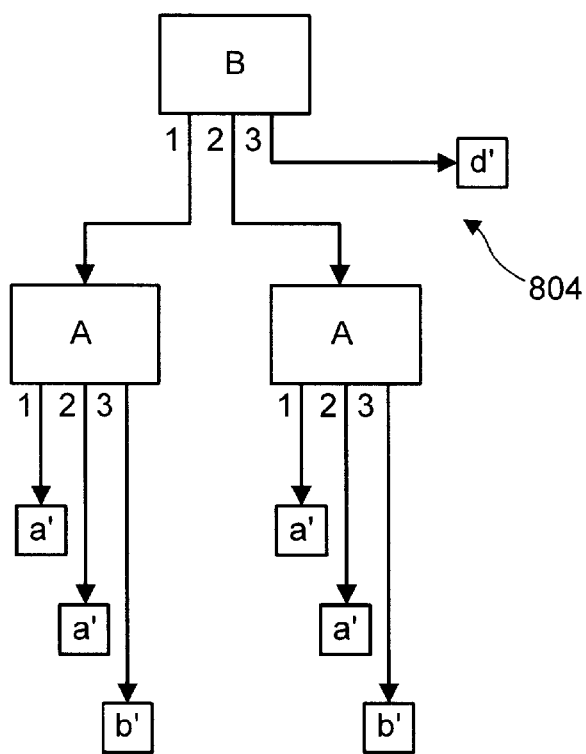
FIG. 8

902
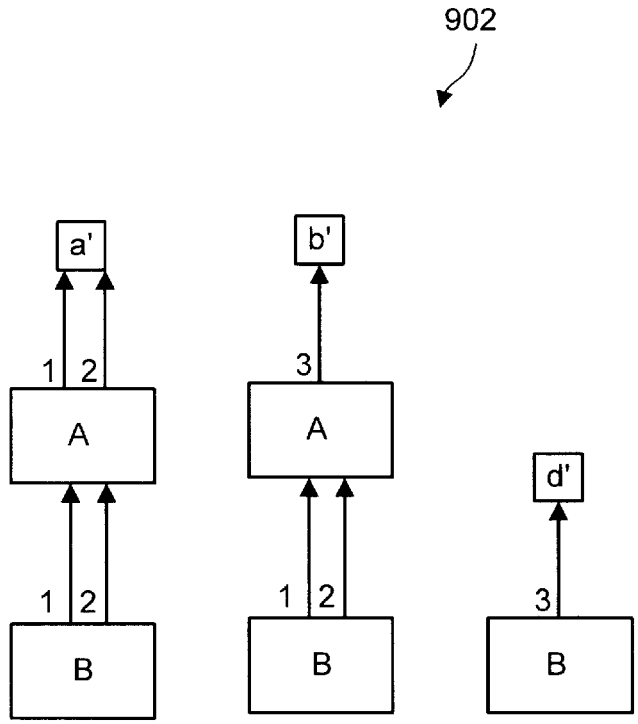
FIG. 9
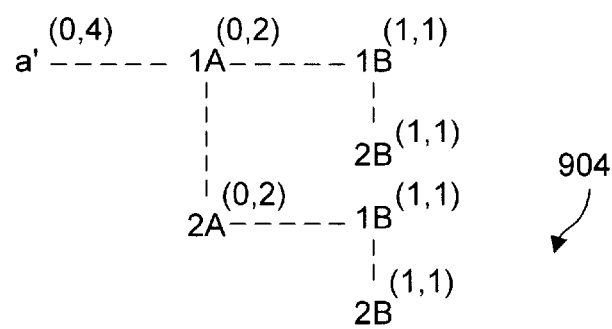
904
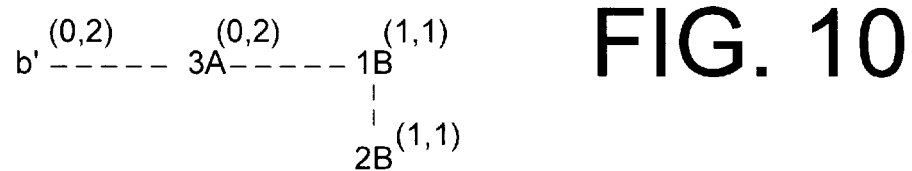
FIG. 10

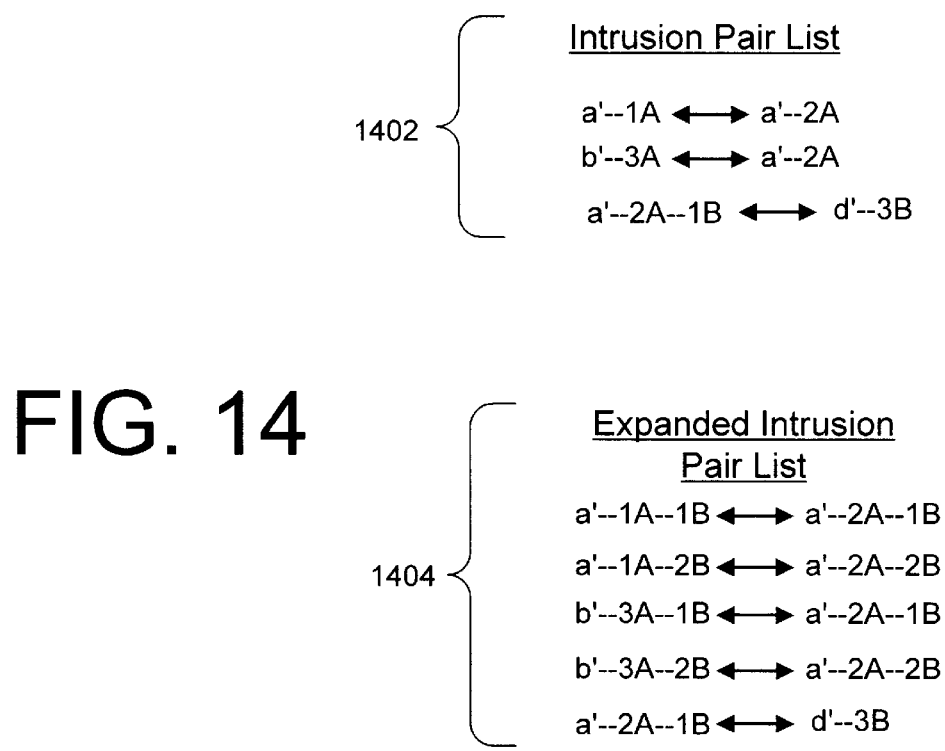

FIG. 18

Shape-to-Net

| Shape   | Net    |
|---------|--------|
| + a'--1A | net1.A |
| - a'--2A | net1.A |
| + b'--3A | net1.A |

FIG. 19

Contains-List

| Net Number | Contains |
|------------|----------|
| net1.A     | + a'--1A |
|            | - a'--2A |
|            | + b'--3A |

FIG. 20

Contained-in-List net1.A $^{(2,2)}$

FIG. 21

Shape-to-Net

| Shape | Net |
|---|---|
| + a'--1A | net1.A |
| - a'--2A | net1.A |
| + b'--3A | net1.A |
| + d'--3B | net2.B |

FIG. 22

Contains-List

| Net Number | Contains |
|---|---|
| net1.A | + a'--1A |
|  | - a'--2A |
|  | + b'--3A |
| net2.B | + d'--3B |
|  | + net1.A--1B |

FIG. 23

Contained-in-List net1.A$^{(1,2)}$ — — 1B$^{(1,1)}$
　　　　　　　　　　net2 net2.B$^{(1,1)}$ net2.B contains:  + d'--3B
+ net1.A--1B
Walking and expanding net2.B yields the following componants:
+ d'--3B
+ net1.A--1B ⟹ + a'--1A --1B
- a'--2A --1B
+ b'--3A --1B
FIG. 24
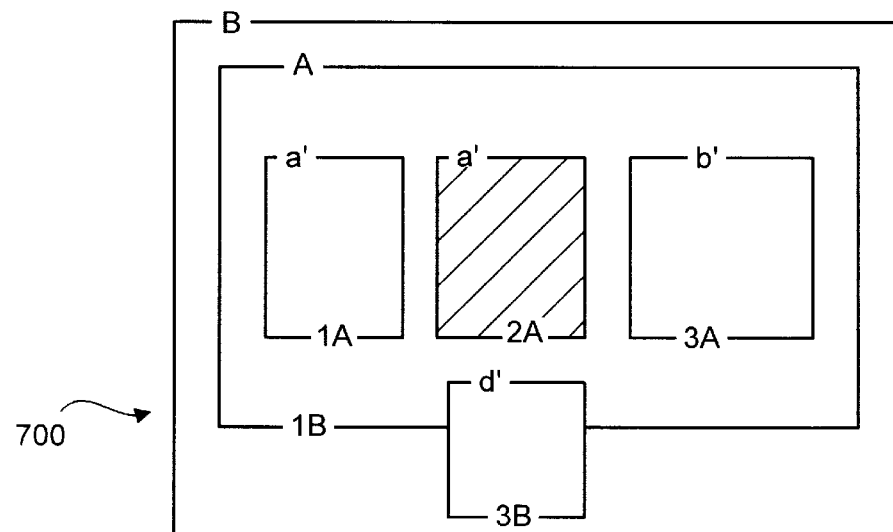
700
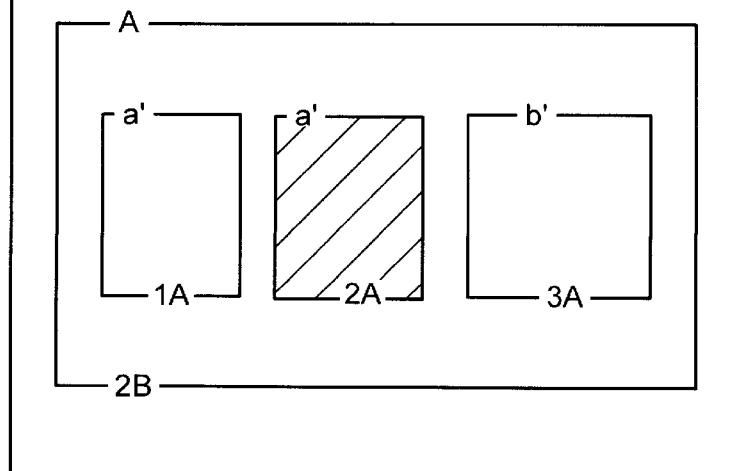
FIG. 25

AUTOMATIC GENERATION OF PHASE SHIFT MASKS USING NET COLORING

RELATED APPLICATION

This application is a continuation application Ser. No. 08/810,844 of U.S. Pat. No. 5,883,813, entitled "Automatic Generation of Phase Shift Masks Using Net Coloring", filled on Mar. 4, 1997, which is hereby incorporated by reference.

BACKGROUND OF THE INVENTION

1. Technical Field

This invention generally relates to VLSI circuit design and more specifically relates to generating phase shifted mask designs.

2. Background Art

A very large scale integrated (VLSI) complementary metal oxide semiconductor (CMOS) chip is manufactured on a silicon wafer by a sequence of material additions (I.e., low pressure chemical vapor depositions, sputtering operations, etc.), material removals (i.e., wet etches, reactive ion etches, etc.), and material modifications (i.e., oxidations, ion implants, etc.). These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers (sometimes referred to as photoresists or resists) which define small areas in which the silicon base (or other) material is modified by a specific operation in a sequence of processing steps. The manufacturing of CMOS chips involves the repeated patterning of photoresist, followed by an etch, implant, deposition, or other operation, and ending in the removal of the expended photoresist to make way for a new resist to be applied for another iteration of this process sequence.

The basic lithography system consists of a light source, a stencil or photomask containing the pattern to be transferred to the wafer, a collection of lenses, and a means for aligning existing patterns on the wafer with patterns on the mask. Since a wafer containing from fifty to one hundred chips is patterned in steps of one to four chips at a time, a lithography stepper is limited by parameters described in Rayleigh's equation:

$$R = k_1 \frac{\lambda}{NA} \quad (1)$$

where $\lambda$ is the wavelength of the light source used in the projection system and NA is the numerical aperture of the projection optics used. $k_1$ is a factor describing how well a combined lithography system can utilize the theoretical resolution limit in practice and can range from 0.8 down to 0.5 for standard exposure systems. The highest resolution in optical lithography is currently achieved with deep ultra violet (DUV) steppers operating at 248 nm wavelength. Steppers operating at a wavelength of 356 nm are also in widespread use.

Conventional photomasks consist of chromium patterns on a quartz plate, allowing light to pass wherever the chromium is removed from the mask. Light of a specific wavelength is projected through a mask onto the photoresist coated wafer, exposing the resist wherever hole patterns are placed on the mask. Exposing the resist to light of appropriate wavelength causes modifications in the molecular structure of the resist polymers which allows a developer chemical to dissolve and remove the resist in the exposed areas. (Conversely, negative resist systems allow only unexposed resist to be developed away.) The photomask, when illuminated, can be pictured as an array of individual, infinitely small light sources which can be either turned on (points covered by clear areas) or turned off (points covered by chrome).

These conventional photomasks are commonly referred to as chrome on glass (COG) binary masks. The perfectly square step function exists only in the theoretical limit of the exact mask plane. At any distance away from the mask, such as in the wafer plane, diffraction effects will cause images to exhibit a finite image slope. At small dimensions, that is, when the size and spacing of the images to be printed are small relative to $\lambda/NA$ (NA being the numerical aperture of the exposure system), electric field vectors of nearby images will interact and add constructively. The resulting light intensity curve between features is not completely dark, but exhibits significant amounts of light intensity created by the interaction of adjacent features. The resolution of an exposure system is limited by the contrast of the projected light image, that is the intensity difference between adjacent light and dark features. An increase in the light intensity in nominally dark regions will eventually cause adjacent features to print as one combined structure rather than discrete images.

The quality with which small images can be replicated in lithography depends largely on the available process latitude; that is, the amount of allowable dose and focus variation that still results in correct image size. Phase shifted mask (PSM) lithography improves the lithographic process latitude or allows operation of a lower $k_1$ value (see equation 1) by introducing a third parameter on the mask. The electric field vector, like any vector quantity, has a magnitude and direction, so in addition to turning the electric field amplitude on and off, the phase of the vector can changed. This phase variation is achieved in PSM's by modifying the length that a light beam travels through the mask material. By recessing the mask by the appropriate depth, light traversing the thinner portion of the mask and light traversing the thicker portion of the mask will be 180° out of phase; that is, their electric field vectors will be of equal magnitude but point in exactly opposite directions so that any interaction between these light beams results in perfect cancellation. For more information on PSM, the reader is referred to "Phase-Shifting Mask: Strategies: Isolated Dark Lines", Marc D. Levenson, *Microlithography World,* March/April 1992, pp. 6–12.

The limits of PSM lithography can be uniquely challenged by the manufacture of high-performance logic derivatives of advanced Dynamic Random Access Memory (DRAM) technologies. These technologies are entering development cycles with immediate requirements for sub-quarter micron printed gate lengths and tight dimensional control on the gate structures across large chip areas. Since these logic technologies are based on shrinking the gate length in an established DRAM technology, the overall layout pitch remains constant for all critical mask levels, resulting in narrow, optically isolated lines on the scaled gate level. The requirement for tight line width control on narrow isolated lines drives the requirement of phase edge PSM's for these logic applications.

Phase edge PSM lithography makes use of contrast enhancement caused by a phase transition under an opaque feature on a mask. This phase transition is achieved by etching an appropriate depth into the quartz mask substrate on one side of a narrow line structure on the mask. Since the 180° phase transition forces a minimum in the image intensity, narrow dark lines will be printed by these excess phase edges. Currently, the unwanted images are erased using a trim mask, a second mask that transmits light only in regions left unexposed by the residual phase edge.

Even though resolution enhancement through the use of phase shifted masks has been extensively proven, implementation of this technique is critically dependent on computer assisted design (CAD) technology that can modify existing circuit designs to incorporate the additional design levels needed to build a phase shifted mask. Design modifications consist of defining regions on the mask that require phase shifting (i.e., by etching into the mask substrate) relative to the rest of the mask, and of trim regions added to eliminate lines printed by unwanted phase edges. The process of defining portions of the mask as 0° phase transition and other portions as 180° phase transition is generally referred to as phase coloring. Phase coloring is traditionally a very time intensive process and has been difficult to effectively automate. Thus, what is needed is a system and method for generating a phase-shifted mask design from an existing CAD database of circuit elements on a VLSI chip.

DISCLOSURE OF INVENTION

According to the present invention, a method is provided for automatically coloring VLSI design elements for the purpose of assigning binary properties to the elements. The preferred method is particularly applicable for generating phase shift mask designs from VLSI CAD datasets. The preferred method uses net coloring to automatically generate a data set of colored elements. The preferred method is not dependent on the order in which the elements are operated upon. The preferred method has the additional advantage of being able to automatically detect conflicts that prevent the VLSI design from being optimally colored. The preferred method is equally applicable to hierarchical VLSI databases with nested components and traditional flat databases. When applied the hierarchical databases, the preferred method provides element coloring with minimal data flattening required.

The foregoing and other features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 2 is a schematic view of an example net of three shapes;

FIG. 3 is a schematic view of an example set of cells containing a plurality of shapes;

FIG. 4 is a schematic view of an example set of cells containing a plurality of colored shapes;

FIG. 8 is a schematic view of a layout tree and an expanded layout tree;

FIG. 9 is a schematic view of a forest of inverse layout trees;

FIG. 10 is a schematic view of a nested net graph;

FIG. 14 is an intrusion pair list and an expanded intrusion pair list;

FIG. 15 is an example shape-to-net table;

FIG. 16 is an example contains-list;

FIG. 17 is an example contained-in-list;

FIG. 18 is an example shape-to-net table;

FIG. 19 is an example contains-list;

FIG. 20 is an example contained-in-list;

FIG. 21 is an example shape-to-net table;

FIG. 22 is an example contains-list;

FIG. 23 is an example contained-in-list;

FIG. 24 is a an example of an expanded net; and

FIG. 25 is a schematic view of a colored design layout.

BEST MODE FOR CARRYING OUT THE INVENTION

The preferred embodiment of the present invention provides a method for auto-solution of a binary design problem using nets and net coloring. The preferred method can be used to assign binary qualities (illustrated as "−" or "+") in a way that eliminates conflicts between design elements.

The preferred embodiment of the present invention is particularly applicable to the problem of auto-generation of a phase shifted mask (PSM) design for a VLSI circuit. In phase-shifted mask designs, portions of the mask are assigned a 0° phase shift and other portions are assigned 180° phase shifts such that the image intensity between the portions is minimized. Thus, the phase shifted mask design is a type of binary problem, one that can be solved using the preferred method.

The preferred method can be adapted to generate phase-shifted mask designs from traditional flat VLSI CAD data or hierarchical VLSI CAD data. The preferred embodiment uses net data structures in a CAD application to verify that a PSM design can be generated from a VLSI design, and auto-generates the phase shift images for the design.

Figure 1:
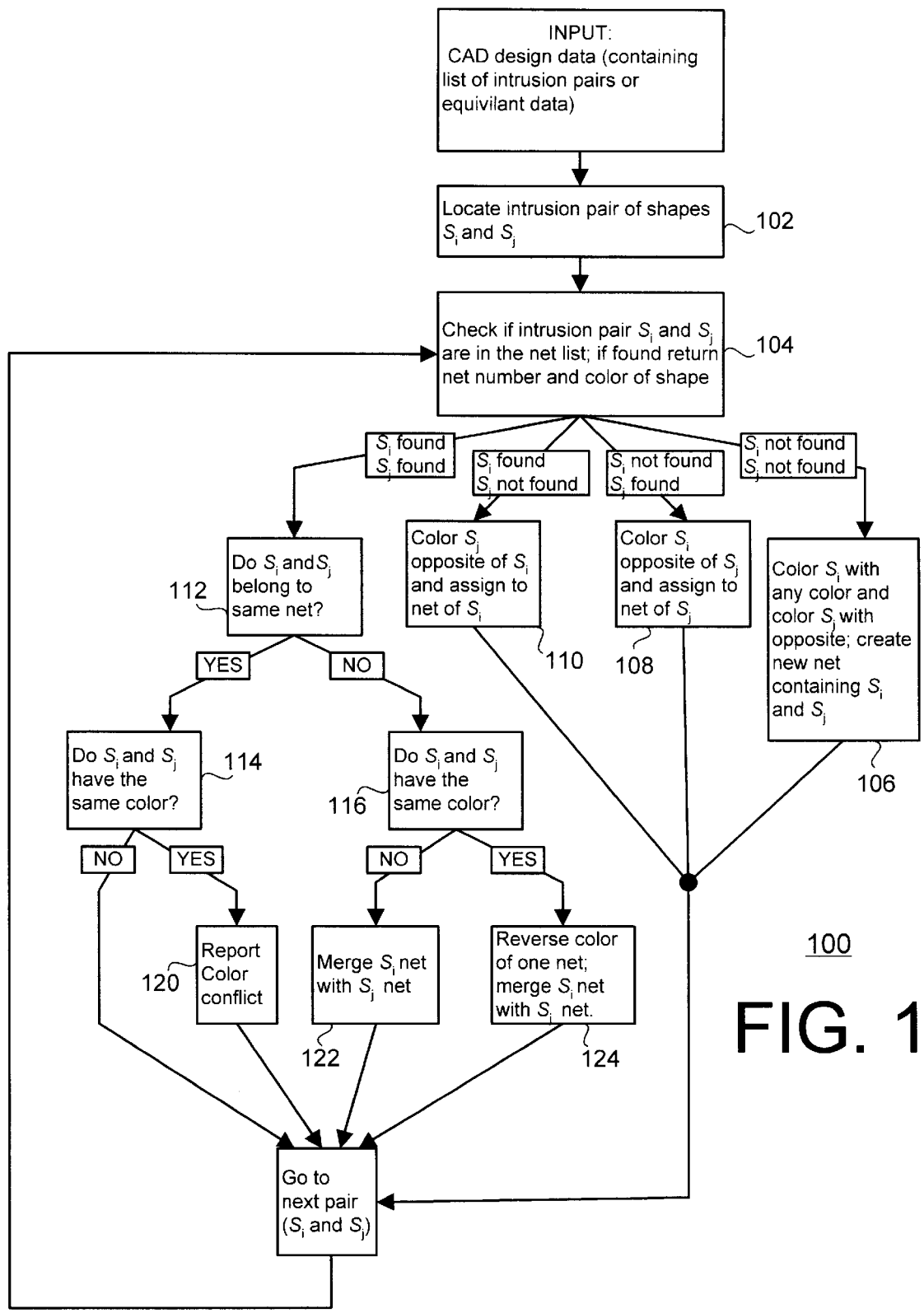
FIG. 1 is a flow diagram illustrating the preferred method 100.
Figure 5:
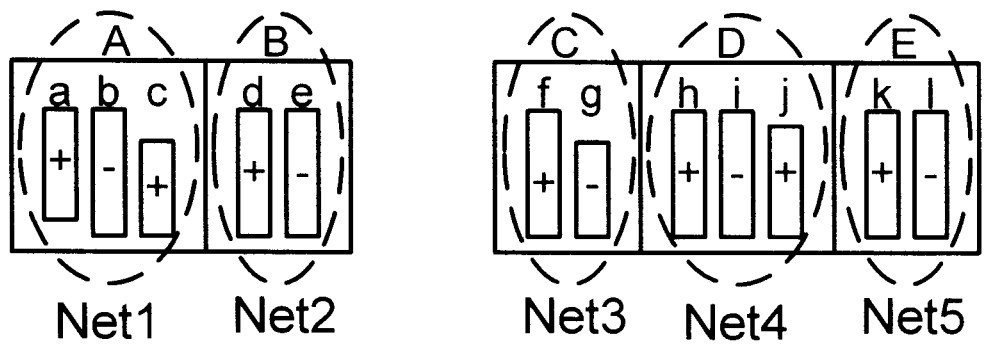
FIG. 5 is a schematic view of an example set of cells containing a plurality of colored shapes assigned a plurality of nets.

Referring now to FIG. 1, there is shown a flow diagram which illustrates the operation of a computer program that uses a net-coloring method 100 for the auto-generation of a VLSI circuit phase shifted mask design. Again, while the net coloring method 100 is illustrated in the context of generating a phase shifted mask design where regions of the phase shifted mask are assigned either a 0° or 180° phase transition, the net coloring method can be adapted to solve any binary coloring problem. Thus, in this application assigning a "color" refers to determining any binary quality. Two binary colors will be referred to as positive ("+") or negative ("−").

The inputs to method 100 include the CAD data structures for the VLSI circuit design. These data structures can include either flat data structures or hierarchical data structures. The CAD data structure inputs include each shape element to be fabricated on a mask, and the location of that shape on the mask. Of course, such a data structure for a VLSI device is extremely complex, and could contain millions of shapes for each mask, with several masks required for each device.

The method 100 as illustrated is preferably for use in a darkfield mask design. In a darkfield design, the element shapes are defined by the transparent regions on the mask. To design a dark-field PSM the phase of the element shape regions are designed with either a 0° or 180° phase shift to minimize the image intensity between the element shapes. As will be discussed later, the method 100 is modified slightly for lightfield mask designs. In lightfield designs, the background to the elements are defined by the transparent regions on the mask. In this case, the background shapes are phase assigned to minimize image intensity between background shapes.

In the generation of phase shift masks, the phase coloring of one shape can affect the phase coloring of a "nearby" shape. Such shapes are "coupled" with respect to phase coloring. Each pair of nearby shapes are referred to as an "intrusion pair," meaning the phase of one determines the phase of the other. The CAD data structure input preferably contains a list of all intrusion pairs or otherwise contains the data from which the intrusion pair list can be derived.

The preferred embodiment method forms a data base of element shapes and their color as assigned. This data base is generally referred to as a net list. A net is a set of shapes that are phase coupled together and are treated as a single entity, with the phase coupling as the "connected" function that allows the shapes to be stored as a net. Nets that are elements of higher level nets are referred to as "nested nets."

For example, turning to FIG. 2, net 1 may comprise element shapes $S_1$, $S_2$ and $S_3$. Shapes $S_1$ and $S_2$ are close enough that they are phase colored together (i.e., light passing through the shapes will interact and increase the image intensity between the shapes.) Thus, $S_1$ and $S_2$ are an intrusion pair. Likewise for shapes $S_2$ and $S_3$. Hence, the whole of net 1, shapes $S_1$, $S_2$ and $S_3$ are phase coupled together. Net 1 could then be colored with $S_1$ and $S_3$ positive and $S_2$ negative. Conversely, net 1 could be colored with $S_1$ and $S_3$ negative and $S_2$ positive. Either way, the intrusion pairs of the net are colored with opposite colors, and thus image intensity between the shapes will be minimized.

By convention, when a net is defined, the coloring of the shapes in the net are defined. The same net with opposite coloring, (i.e, every shape in the net colored the opposite color) is referred to as the "reverse color" net. The reverse color transform to a net reverses the color of the entire net, but does not affect the color-coupled relationship of any of the shapes within the net. In the net list database created by the operation of method 100 the reference to a nested net indicates if the nested net is to be included "as is" or "reverse color."

Returning to FIG. 1, when the net coloring method 100 begins, no shapes will be assigned nets or colors. The method 100 will continue until all intrusion pairs are located and all shapes are colored and assigned a net.

In step 102, the preferred method locates two nearby shapes $S_i$ and $S_j$ on a wafer mask. These shapes are close enough to be phase coupled with each other and form an intrusion pair, and hence the preferred design is to assign them opposite colors (opposite phase transitions of 0° and 180°) such that when the mask is used there is a minimum image intensity between them.

The next step 104 is to determine if the two nearby shapes $S_i$ and $S_j$ have already been colored and stored as part of a net in the net database. If either or both of the shapes are found, the net the shapes belong to and the current color of the shapes are returned. There are four possible next steps based upon if either or both of $S_i$ and $S_j$ are found in a preexisting net.

If neither $S_i$ nor $S_j$ is found, the next step 106 is to arbitrarily color $S_i$ and $S_j$ and to form a new net comprised of $S_i$ and $S_j$. Thus, $S_i$ can be positive and $S_j$ negative or vice versa. The assignment of color does not matter because at this time, the shapes are not now known to interact with any other shapes. With the shapes so colored and assigned to a new net, the method 100 proceeds to the next pair of intrusion shapes.

If $S_j$ is found and $S_i$ is not, the next step 108 is to color $S_i$ the opposite color of $S_j$ and assign $S_i$ to the net of $S_j$. Thus, the intrusion pair $S_i$ and $S_j$ is colored opposite colors and assigned to a net of phase coupled shapes. With the shapes so colored and $S_i$ assigned to the net of $S_j$, the method 100 proceeds to the next pair of intrusion shapes.

If $S_i$ is found and $S_j$ is not, the next step 110 is to color $S_j$ the opposite color of $S_i$ and assign $S_j$ to the net of $S_i$. Thus, the intrusion pair $S_i$ and $S_j$ are colored opposite colors and assigned to a net of phase coupled shapes. With the shapes so colored and $S_j$ assigned to the net of $S_i$, the method 100 proceeds to the next pair of intrusion shapes.

If both $S_i$ and $S_j$ are found, the next step 112 is to determine if both shapes currently belong to the same net. If they both belong to the same net, the next step 114 is to determine if $S_i$ and $S_j$ both currently have the same color. If they are assigned different colors, then there is no conflict and nothing needs to be done to the color assignment or net assignment of these to shapes. The method 100 then proceeds to the next pair of intrusion shapes.

If, however, step 114 determines that $S_i$ and $S_j$ both have the same color, a color conflict exists. Therefore, in the current mask design, $S_i$ and $S_j$ cannot be colored opposite colors without creating additional color conflicts. This means there is no solution that results in no conflicts and the next step 120 is to report the color conflict.

Returning to step 112, if shapes $S_i$ and $S_j$ did not belong to the same net the next step 116 is to determine if $S_i$ and $S_j$ both currently have the same color. If $S_i$ and $S_j$ have opposite colors there is no conflict and the next step 122 is to merge the net of $S_i$ and the net of $S_j$ together and store the resulting net as a one new net.

If $S_i$ and $S_j$ have the same colors there a conflict and the next step 124 is to reverse the color of one net and then merge the nets. Again, it does not matter which net is reversed, the net of $S_i$ can be reversed and merged with the net of $S_j$ or the net of $S_j$ can be reversed and merged with the net of $S_i$. Either way, the result is one net containing both $S_i$ and $S_j$ with no color with all the shapes of the net properly assigned a color.

The method 100 continues until all intrusion pairs have been located and assigned a color and a net. Those shapes that are not nearby any other shape can be arbitrarily assigned either color unless otherwise constrained.

In particular, with a flat CAD data structure the method 100 is processed until all intrusion pairs have been cycled through and assigned to nets. The process does not depend upon the selection of a particular starting point, ending point or order of intrusion pair checking.

Turning now to FIGS. 3–6, the preferred method 100 will be illustrated in the context of a flat CAD data base. Of course, the example of FIGS. 3–6 is much simpler than the shapes stored in an actual VLSI CAD database.

Turning to FIG. 3, a simplified VLSI design 300 is illustrated. The VLSI design 300 contains a plurality of cells A, B, C, D and E. Each of the plurality of cells contains a plurality of mask shapes. In particular, cell A contains shapes a, b and c; cell B contains shapes d and e; cell C contains shapes f and g; cell D contains shapes h, i and j; and cell E contains shapes k and l. In this example, the mask is a darkfield mask and the shapes a–l are implemented as transparent regions on the mask.

Turning now to FIG. 4, the method 100 starts by generating a list of intrusion pairs or retrieving such a list if one already exists for the VLSI design 300. Intrusion pairs are shapes close enough to interfere with one another. Thus, there are 10 intrusion pairs in VLSI design 300. In particular, cell A includes two intrusion pairs a–b and b–c. Likewise, cell B includes one intrusion pair d–e; cell C includes one intrusion pair f–g; cell D includes two intrusion pairs h–i and i–j; and cell E includes one intrusion pairs k–l. Additional intrusion pairs exist between shapes of adjacent cells. In particular, intrusion pair c–d exists between shape c of cell A and shape d of cell B; intrusion pair g–h exists between shape g of cell C and shape h of cell D; and intrusion pair j–k exists between shape j of cell D and shape k of cell E.

The method 100 then selects one of the list of intrusion pairs to begin operating on. In the preferred method, the order the intrusion pairs are operated on does not effect the ability to generate a phase shift mask design. Thus, the method can start at any intrusion pair and work through the intrusion pairs in any order. For illustration purpose, the method 100 will be illustrated as working through the intrusion pairs in each cell and then working through intrusion pairs between cells.

Thus, starting with intrusion pair a–b, the first step 104 is to check the net list to determine if shapes a and/or b are assigned a net and color. In this case the process is just starting and neither shape a nor shape b are colored or assigned nets. The next step 106 is to assign one shape one color and the other shape the other color. In this case, shape a is assigned "+" and shape b is assigned "−". Shapes a and b are added to the net list as net 1 with their assigned colors stored in the net list.

The method 100 then proceeds to the next intrusion pair b–c. Again, according to step 104, the net list is checked to see if shapes b and c are contained. In this case, shape b is found and shape c is not found. The next step 110 is then to color shape c the opposite of color of shape b, and add shape c to the net 1 with shape b. This results in net 1 containing shapes a, b and c colored "+", "−" and "+" respectively.

The method 100 then proceeds to the next intrusion pair, shapes d and e of cell B. Again, according to step 104, the net list is checked to see if shapes d and e are already in the net list. In this case, neither shape d nor shape e are in the net list. The next step 106 is to assign one shape one color and the other shape the other color. In this case, shape d is assigned "+" and shape e is assigned "−". Shapes d and e are added to the net list as net 2 with their assigned colors stored in the net list.

The method 100 then proceeds to the next intrusion pair, shapes f and g of cell C. Again, according to step 104, the net list is checked to see if shapes f and g are already in the net list. In this case, neither shape f nor shape g are in the net list. The next step 106 is to assign one shape one color and the other shape the other color. In this case, shape f is assigned "+" and shape g is assigned "−". Shapes f and g are added to the net list as net 3 with their assigned colors stored in the net list.

The method 100 then proceeds to the next intrusion pair, shapes h and i of cell D. Again, according to step 104, the net list is checked to see if shapes h and i are already in the net list. In this case, neither shape h nor shape i are in the net list. The next step 106 is to assign one shape one color and the other shape the other color. In this case, shape h is assigned "+" and shape i is assigned "−". Shapes h and i are added to the net list as net 4 with their assigned colors stored in the net list.

The method 100 then proceeds to the next intrusion pair, shapes i and j of cell E. Again, according to step 104, the net list is checked to see if shapes i and j are already in the net list. In this case, shape i is found in net 4 and shape j is not found. The next step 110 is then to color shape j the opposite of color of shape i, and add shape j to the net 4 with shape i. This results in net 4 containing shapes h, i and j colored "+", "−" and "+" respectively.

The method 100 then proceeds to the next intrusion pair, shapes k and l of cell D. Again, according to step 104, the net list is checked to see if shapes k and l are already in the net list. In this case, neither shape k nor shape l are in the net list. The next step 106 is to assign one shape one color and the other shape the other color. In this case, shape k is assigned "+" and shape i is assigned "−". Shapes k and l are added to the net list as net 5 with their assigned colors stored in the net list.

At this point, the method 100 has colored the VLSI design 300 as illustrated in FIG. 4. Of course, the method 100 could have resulted in any of the nets being colored in the reverse color, because the only restrictions on the color are the color of adjacent shapes in the net. The method 100 continues checking the remaining intrusion pairs.

Thus, the method 100 proceeds to the next intrusion pair, shape c of cell A and shape d of cell B. According to the method 100, these intrusion pairs are located and the net value and color of the shapes are returned. In this case, for the intrusion pair c–d, both shapes are found in existing nets. Thus, according to step 112, the next step is to determine if they belong to the same net. In this case shape c belongs to net 1 and shape d belongs to net 2. Thus, the next step 116 is to determine if the shapes have the same color. Because shape c and shape d are both colored positive, there is a conflict in this intrusion pair. The next step 124 is to reverse the color of one net and merge the two nets together as a new net. Thus, a new net 6 is formed that comprises the original net 1 and the reverse of net 2 (denoted as net 2'). Of course, net 6 could just as easily comprise the reverse of net 1 and the original net 2.

The method 100 proceeds to the next intrusion pair, shape g of cell C and shape h of cell D. According to the method 100, these intrusion pairs are located and the net value and color of the shapes are returned. Again, both shapes are found in existing nets. The next step 112 is to determine if they belong to the same net. In this case shape g belongs to net 3 and shape h belongs to net 4. Thus, the next step 116 is to determine if the shapes have the same color. Because shape g is negative in net 3 and shape h is positive in net 4, there is no color conflict in this intrusion pair. The next step 122 is to merge the two nets together as a new net. Thus, a net 7 is formed that comprises the original net 3 and the original net 4.

Thus, the method 100 proceeds to the next intrusion pair, shape j of cell D and shape k of cell E. According to the method 100, these intrusion pairs are located and the net value and color of the shapes are returned. In this case, for the intrusion pair j–k, both shapes are found in existing nets.

Thus, according to step 112, the next step is to determine if they belong to the same net. In this case shape j belongs to net 7 and shape k belongs to net 5. Thus, the next step 116 is to determine if the shapes have the same color. Because shape j and shape k are both colored positive, there is a conflict in this intrusion pair. The next step 124 is to reverse the color of one net and merge the two nets together as a new net. Thus, a new net 8 is formed that comprises the original net 7 and the reverse of net 5 (denoted as net 5'). Of course, net 8 could just as easily comprise the reverse of net 7 and the original net 5.

Figure 6:
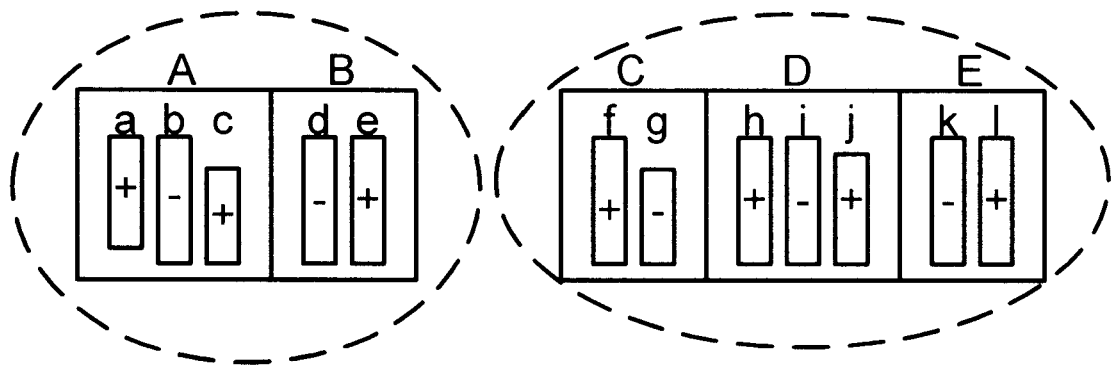
FIG. 6 is a schematic view of an example set of cells containing a plurality of colored shapes assigned a plurality of nets.

This results in the VLSI design 300 being colored and assented to nets and as illustrated in FIG. 6. Thus, the preferred method 100 is able to color the shapes that make up a VLSI design such that image intensity between shapes is minimized.

Although the example of FIGS. 3–6 show only five cells, a true VLSI data structure would have many more and the process would continue through all of them. Thus, the method 100 when applied to a VLSI CAD data structure uses net listing to auto-generate the color of the various shapes in the resulting mask. The process searches for intrusion pairs and looks to see if there is a coloring conflict between shapes in the intrusion pair. The process works its way through the intrusion pairs until all have been worked through. Conflicts between shapes in an intrusion pair are eliminated by reversing the color one of intrusion pairs respective nets. If at any time a solution is not possible (i.e., because the conflicting pair already belong to the same net) the failure can be immediately reported and localized.

The preferred method 100 can also be applied to phase-shifted mask design for light-field mask designs with slight modification. In light-field designs, the background to the elements are defined by the transparent regions on the mask. In this case, the background shapes are phase assigned to minimize image intensity between background shapes.

In the light-field PSM case the "shapes" to be colored are shapes designed by a PSM design routine based on the designed device shapes in the original CAD dataset. The specified interaction is again a minimum separation between any two designed shapes with the additional constraint that only separations measured across the width of the device shapes are significant in forcing opposite color while a minimum separation "over air" (i.e. without any device shapes between the phase shapes) forces an equal color. Thus, with simple modification the preferred method can be applied to both light-field and dark-field mask design systems.

In addition to working with flat VLSI CAD data structures, the preferred embodiment of the present invention can be applied to hierarchical VLSI CAD data structures. Many CAD systems describe the physical design of VLSI devices in the form of hierarchical 2-dimensional geometric models. These systems simplify the complex task of designing VLSI devices, but have traditionally had problems analyzing the hierarchical design. The primary reason for this is that traditional methods have analyzed the data flat, (i.e., all instances of mask shapes are transformed into the coordinate system of the root node of the design) whereas mask data is typically designed nested (i.e, the mask shapes are designed hierarchically and may be reused in a design many times). One system and method for creating hierarchical representations of interconnections between VLSI circuit design components to facilitate the analysis of a design while still in its nested form was described by Kim et al. in "System and Method for Building Interconnections in Hierarchical Circuit Design," U.S. Pat. No. 5,481,473, and assigned to International Business Machines Corp. The system uses a form of the graphical technique known as inverse layout trees to describe the interconnections. The inverse layout tree is a forest of trees each rooted at a leaf node of the layout tree. Thus, in a typical implementation, a design mask shape would form the root of an inverse layout tree, while the leaves would represent flat layouts of the rooted mask shape. The use of the inverse layout tree has provided a means for manipulating instances of a mask shape at varying levels of nesting.

The system and method disclosed in the '473 patent represents interconnections between design components as a nested net graph which includes a list of nets and instance counts associated with each net. The nested net graph may also further include a second list which specifies the instances of lower nested nets contained in the nested net graph and a shape-to-net table that defines the mapping of VLSI design components to corresponding nets.

This system uses nets to group components of a design that are interconnected by some set of rules. In particular, the system uses nested net synthesis to identify and store the interconnection data between shapes in a nested component design. In particular, the system uses nested net synthesis to identify and store interconnections (such as electric or magnetic interconnections) of VLSI design components of a nested design while maintaining the data in its nested form.

Similarly, nested net synthesis can be used to identify and store phase coupling between mask shapes in a hierarchical VLSI database and the preferred method of the present invention can operate on this database to appropriately color the mask shapes to minimize the image intensity between them.

Figure 7:
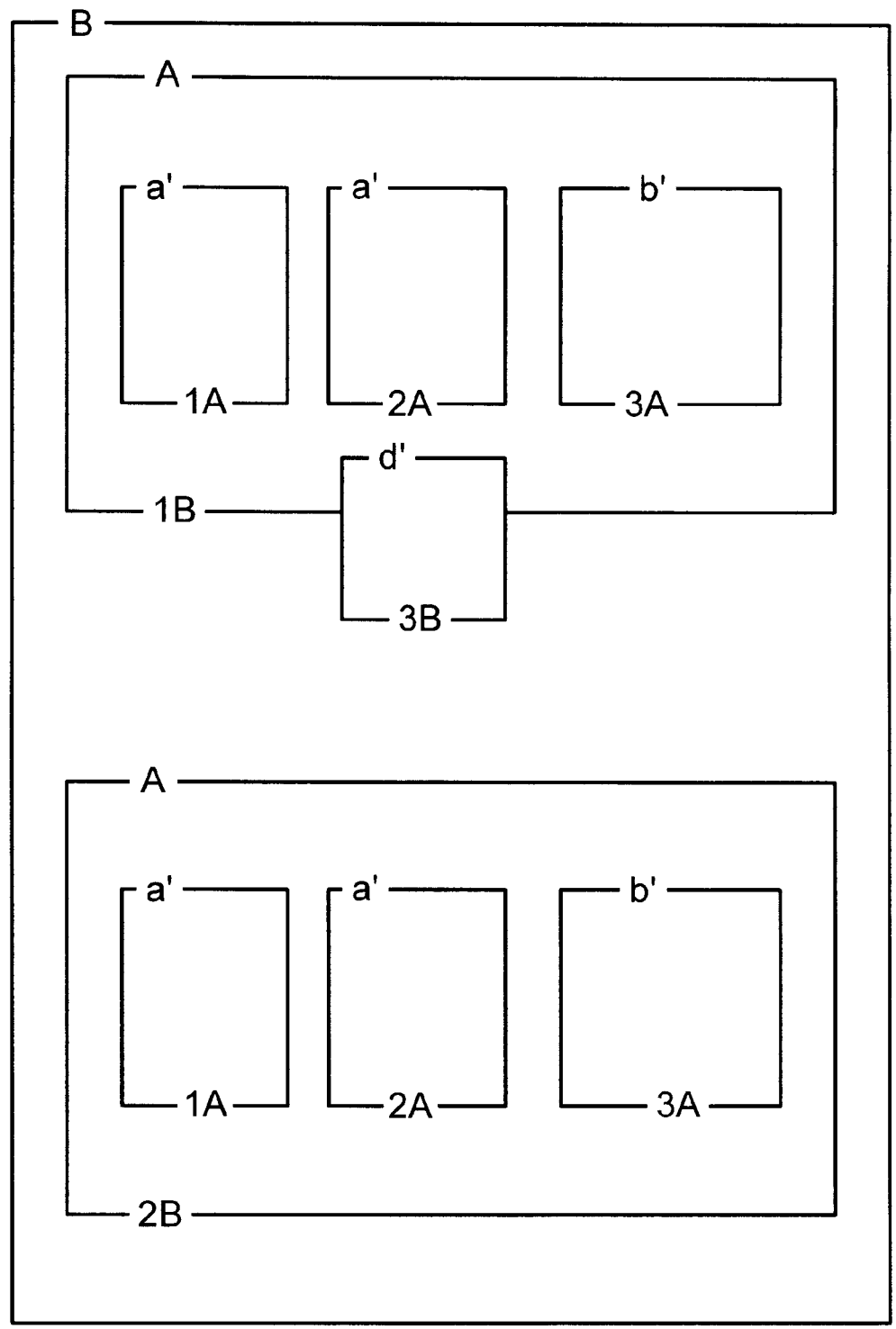
FIG. 7 is a schematic view of a design layout.

Accordingly, a brief review of nested net synthesis will be given and described with reference to its use in describing the phase coupling between mask shapes. Turning now to FIG. 7, a an exemplary hierarchical design layout 700 is illustrated. The design layout 700 will be used to demonstrate nested net synthesis. The design is divided into cells A and B. The design layout 700 uses three cells which each contain one shape, called "leaf shapes," denoted a', b' and d'. Shape a' is used four times, shape b' used twice, while shape d' is used once.

Turning to FIG. 8, a layout tree for design 700 is shown at 802 and a expanded layout tree is shown at 804. The expanded layout tree 804 comprises cell B, which contains two instances of cell A and one instance of d'. The two instances of cell A are denoted as 1B and 2B reflecting the path from cell B to the two instances. Likewise, the instance of d' is denoted as 3B reflecting the path from cell B. Each instance of Cell A contains two instances of cell a', denoted 1A and 2A and one instance of cell b', denoted 3A. Cells a', b', and d' each consist of a single shape which is shown as the bounding box of the cell. The notation used represents leaf cells (cells that contain a single shape) with lower case letters. For example, a' indicates a leaf cell containing a shape a'.

A specific instance of a shape within a layout tree is described by enumerating the transform path of the shape which, as mentioned, is a graph. Graphs have internal nodes and leaf nodes. When the root node of a graph is not a leaf node, it is generally treated as an internal node. Processing of graph data occurs at the leaf nodes of the graph; when an internal node is significant, it is treated as a leaf node of a sub-graph. When a set of leaf nodes can be processed at a common internal node, the graph is defined to have been pruned to the internal node. An example is shown at 804, which illustrates the four instances of a' and two instances of b' in cell B. The first instance path of a', a' - - - 1A - - - 1B, enumerates the path from a' to B via 1A (the first transform in A) and 1B (the first transform of B). Likewise, the second instance path of a', a' - - - 2A - - - 1B, enumerates a path from a' to B via 2A and 1B. Likewise, a' - - - 1A - - - 2B and a' - - - 2A - - - 2B enumerate the third and fourth instance paths. The two 1A instances of a' can be denoted by the path a' - - - 1A. Thus, where a shape intrudes on only the first instance of a', it would be denoted as intruding on a' - - - 1A - - - 1B. Where a shape intrudes on both 1A instances of a', it would be denoted as intruding on a' - - - 1A. Likewise, all four instances of a' are denoted by the a' symbol alone. Thus, the representation of a shape instance as an enumerated transform path provides a handle to a partially nested shape, permitting its unique identification or its treatment in its nested location.

The use of transform paths as a means to identify particular shape instances has led to the use of an inverse layout tree rooted at each leaf shape to manipulate shape instances. In general, the inverse of the layout tree is a forest of trees each rooted at a leaf shape. Turning to FIG. 9, a forest of inverse layout trees 902 are used to denote design 700. The inverse layout trees 902 may be used to define all possible instances of a leaf shape. FIG. 10 shows the inverse layout trees illustrated graphically at 904 in an expanded manner with each node illustrated separately. Each node in the inverse layout trees is associated with a pair of numbers in graph 904. The second number represents the total possible number of instances that can be represented at a node. The first number represents the actual number of instances that are represented at the this node.

This graphical representation of the inverse tree layout can be used to represent interactions between nested components. These interactions are preferably represented at the most nested level possible. Thus, the inverse layout trees are "pruned" where possible to allow manipulation of the shapes at the most nested level.

Figure 11:
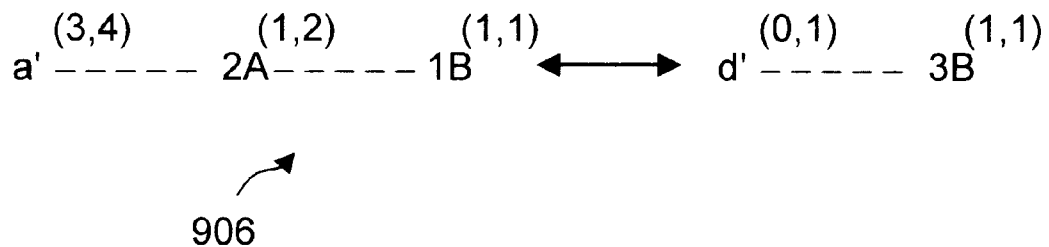
FIG. 11 is a schematic representation of an intrusion pair of shapes.
Figure 12:
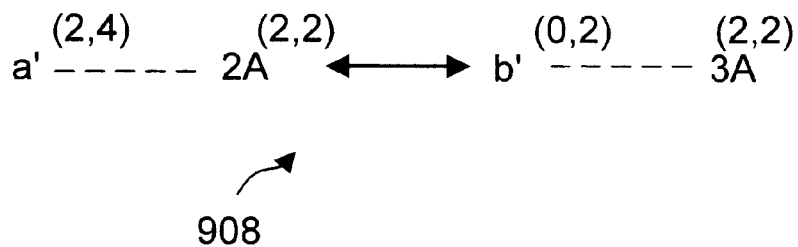
FIG. 12 is a schematic representation of an intrusion pair of shapes.

For example, FIG. 11 depicts a "pruned" inverse layout tree 906. In this example, the a' - - - 1A - - - 1B instance of a' interacts with (i.e., forms an intrusion pair with) d' - - - 3B, while none of the other instances of a' intrude upon d' - - - 3B and thus form a net. Turning to FIG. 12, in a second example is illustrated as "pruned" inverse layout tree 908. In this example, the a' - - - - 2A instances of the a' shapes each intrude respectively with the b' - - - 3A instances of the b' shape. Thus, the intrusion between a' and b' shapes can be represented as the "pruned" inverse layout tree 908.

Figure 13:
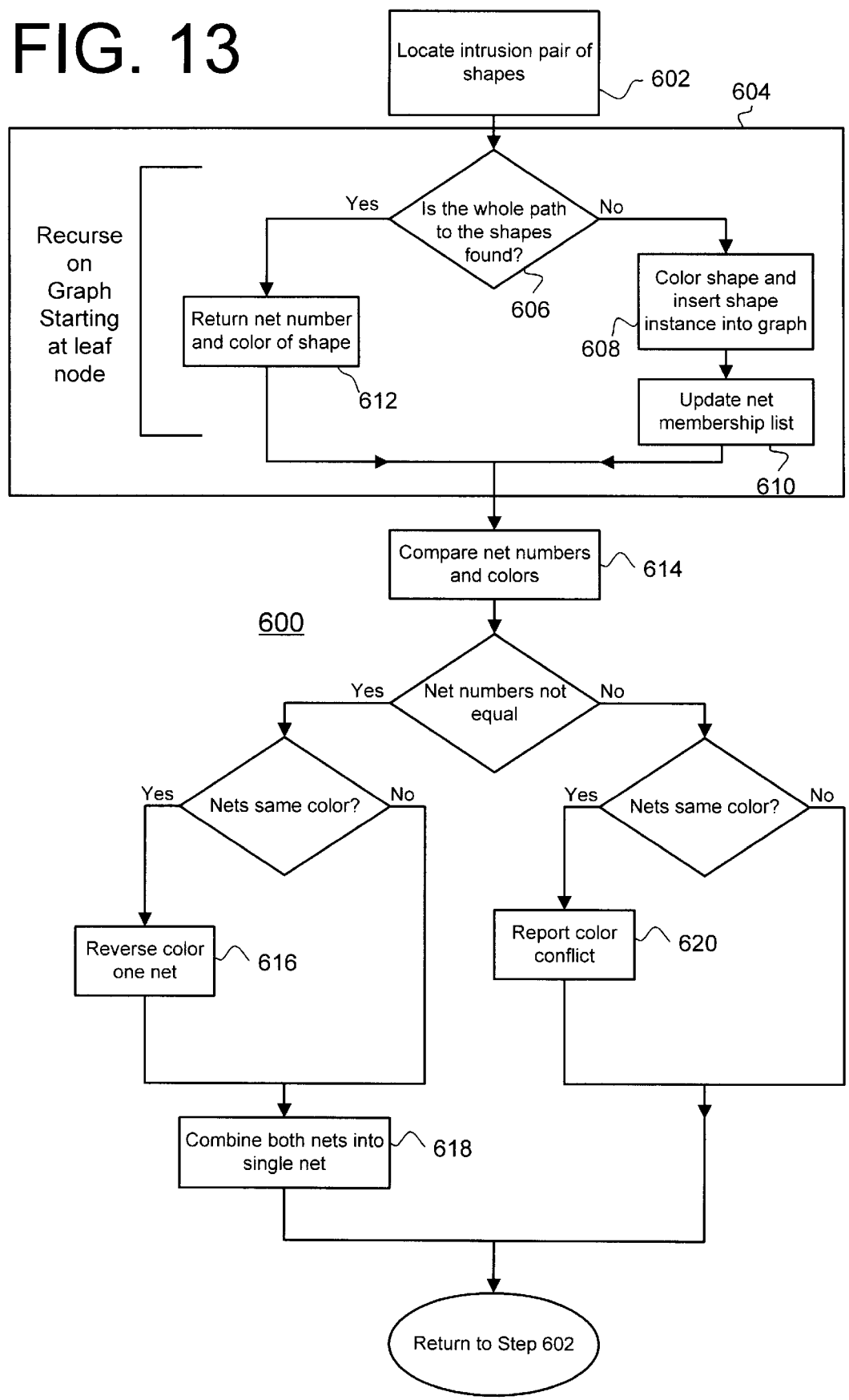
FIG. 13 is a schematic representation of preferred method for nested databases.

Turning now to FIG. 13, a flowchart illustrates a method 600 for building a nested net database (referred to as a net graph) of VLSI design elements (i.e., phase coupled mask shapes) and coloring the shapes in a way that minimizes undesirable interaction between elements (i.e., the image intensity between mask shapes.) The nested net database will include a nested representation of the shape interaction. The nested net database includes a contains-list and a contained-in-list. The contains-list is preferably a table containing a list of the nets and the elements (i.e., a shape or a transform of another net) in each net, stored in its nested form. In the preferred embodiment, the contains-list includes a color bit for each element to indicate whether the element is incorporated in standard ("+") or reverse ("−") color. Thus, a shape can be incorporated into a net in either a standard ("+") or reverse ("−") color. Likewise, a transformed net can be incorporated in either standard ("+") color (i.e., all elements in the transformed net are incorporated as is) or reverse ("−") color (i.e., all elements in the transformed net are incorporated in their opposite color).

The contained-in-list is a representation of the nets in a nested form. In particular, the contained-in-list shows which instances of which nets have interactions with higher level nets. Instance counts are stored at each net as a pair of numbers, the first number denotes how many nets are actually rooted at that node in the graph. The second number denotes the number of net instances that are not part of higher level nets. An instance count of zero indicates that all the instances of that net are elements of higher level nets.

The contains-list and contained-in-list allows a program, given a net, to walk the net from the root node and identify all of its nested components. Conversely, given a nested component, a program may identify the root of the net(s) connected to an instance of the component.

At the first step 602 in method 600, an intrusion pair of mask shapes is located. Again, the intrusion pair of shapes are a set of shapes that are close enough in the mask design that light traveling through the mask shapes interfere with each other. Various methods can be used to generate the list of intrusion pairs. The intrusion pair is denoted in an inverse layout graph which has a common leaf node where the shapes are interconnected. At step 604, each shape instance in the intrusion pair is identified as belonging to a net with a net number and having a color.

In the preferred embodiment, step 604 can be further subdivided as shown at steps 606–612. Steps 606–612 are performed for each shape instance in the intrusion pairs. These steps are preformed recursively to effectively walk the ancestor graph of the VLSI design component instance starting at the leaf node of the inverse graph. At step 606, it is determined whether the shape instance is already colored and in a net. A shape instance is found in a net only when the whole path to the shape is already found in a net in the nested net graph. This is the case where the present ancestor node (or the leaf node, if there are no ancestors) is the root of the ancestor graph. If the whole path to a shape is found in the nested net graph, the net number and associated color is returned at 612.

If the whole path to shape instance is not found, the shape instance of the net is inserted into the nested graph starting at the leaf node of the shape instance. In particular, at step 608 the shape instance is inserted into the nested graph by forming a contains-list entry and a contained-in-list entry for the shape instance. At 610, the net membership lists are updated by updating the bidirectional pointers that point to other already existing nets. The method then recurses back to step 606 and determines if the whole path to the shape instance is now found. If the whole path is still not found, the next node on the ancestor graph is inserted into the nested net graph. This process thus continues until the whole path to the shape is found in the nested net graph, and at 612 the net number and color of the shape instance ("+", the default color) are returned.

Thus, the recursive process in 604 returns the net numbers and colors for both shape instances in the intrusion pair. Following completion or the recursive process in 604, the net coloring of the shapes continues at 614, where the two net numbers obtained from the recursion are compared with one another and the colors of the two shape instances are compared with one another.

If the net numbers are not equal and the shape instances are the same color the next step 616 is to reverse the color of one net, and then at 618 to combine both nets into a single net. To reverse the color of a net, the color of each shape and each net transform is reversed (i.e., "+"→"−", "−"→"+"). Each net that contains the color reversed net must now accommodate the change by reversing their colors. The method 600 then returns to the next intrusion pair at step 602.

If the net numbers are not equal and the shape instances are opposite colors, the coloring is proper and the next step 618 is to combine both nets into a single net. The method 600 then returns to the next intrusion pair at step 602.

If the net numbers are equal and the shape instances are the same color the shapes cannot be colored to minimize image intensity and the next step 620 is to report a color conflict. The method 600 then returns to the next intrusion pair at step 602.

If the net numbers are equal and the shape instances are different colors, than the net membership and colors are correct, and the next step is to return to step 602 and move on to the next intrusion pair.

The method 600 continues until all intrusion pairs are processed and those shapes that can be colored are colored.

The preferred method 600 will now be described with reference to the layout design 700. The first step is to retrieve or generate a list of intrusion pairs for the design 700. In the design 700 there are three intrusion pairs using the nested representation of the shapes as illustrated in FIG. 14 at 1402. However, these three nested intrusion pairs represent five actual intrusion pairs (i.e, the intrusion pair a' - - - 1A and a' - - - 2A represents two intrusion pairs, a' - - - 1A - - - 1B to a' - - - 2A - - - 1B and a' - - - 1A - - - 2B to a' - - - 2A - - - 2B) as illustrated at 1404.

Again, the nested net database of colored shapes will include a nested representation of the shape interaction. The nested net database includes a contains-list and a contained-in-list. The contains-list is preferably a table containing a list of the nets and the elements (i.e., a shape or a transform of another net) in each net, stored in its nested form. In the preferred embodiment, the contains-list includes a color bit for each element to indicate whether the element is incorporated in standard ("+") or reverse ("−") color. The contained-in-list is a representation of the nets in a nested form. In particular, the contained-in-list shows which instances of which nets have interactions with higher level nets. Additionally, a shape-to-net table may be used to correlate leaf shapes instances with their associated nets.

The contains-list and contained-in-list allows a program, given a net, to walk the net from the root node and identify all of its nested components. Conversely, given a nested component, a program may identify the root of the net(s) connected to an instance of the component.

Beginning at step 602, the first intrusion pair of shape is located. The first intrusion pair includes shapes a'- - - 1A and a' - - - 2A. Because initially there are no shapes assigned to nets, neither shape instance is found in the shape-to-net table, both shapes are added to new nets and colored the default color ("+") according to step 604. This is accomplished by starting at the leaf node of the shape instance and adding that node to the nested net database, and recursively adding nodes until the whole path to the intrusion pair's shape instances are found. The next step 614 is to compare the nets and colors of both shapes in the instance pair. With both shapes belonging to different nets and both colored "+" the next step 614 is to reverse the color of one net and then combine both nets into a single net at step 618.

Thus, a new net is formed in cell A and entries are made in the shape-to-net table illustrated in FIG. 15 to indicate that shape a' - - - 1A belongs to net1 in A shape a' - - - 2A belongs to net1 in A. Likewise the contains-list, illustrated in FIG. 16, is updated to indicate that net1 in cell A (net1.A) contains two shapes, a positive "+" colored a' - - - 1A and negative "−" colored a' - - - 2A. The resulting contained-in-list is illustrated in FIG. 17 and indicates that there are a total of two instances of net1, and neither instance is an element of any other net.

Returning to step 602, processing continues with the second intrusion pair of list 1402, shape a' - - - 2A and shape b' - - - 3A. Shape a' - - - 2A is already colored "−" and in the shape-to-net table, but shape b' - - - 3A is not assigned a net. Thus, according to step 608 shape b' - - - 3A is colored "+" and assigned a new net. At step 614, the color and net numbers of the shapes are compared. With the shapes in different nets and colored differently, at step 618 the nets are combined into a single net. Accordingly, b' - - - 3A is added to net1 .A as illustrated in the shape-to-net table in FIG. 18. The b' - - - 3A shape is thus colored "+" and the color stored in the contains-list as illustrated in FIG. 19. The resulting contains-list reflects that net1 in cell A contains three shapes, with shapes a' - - - 1A and b' - - - 3A colored "+" and shape a' - - - 2A colored "−." The contained-in-list is illustrated in FIG. 20, and remains unchanged, although each instance of net1.A now contains three shapes, no new instances have been added.

Returning to step 602, processing continues with the third intrusion pair of list 1402. The third intrusion pair is between the shape d' - - - 3B and shape a' - - - 2A - - - 1B (only one instance of the a' shape; there is no intrusion with the 2B instance of shape a' - - - 2A.) At step 604, neither shape instance is assigned a net. This means that the nested representation must be expanded a level to fully describe these interactions.

In particular, Shape a' - - - 2A is already in the shape-to-net table. However, the 1B instance of net1.A with shape d' - - - 3B is not. Accordingly, d' - - - 3B is added to the shape-to-net table and a new net is created and contains that shape with the "+" color as illustrated in FIG. 21. Additionally, a new net is created that contains net1.A - - - 1B instance with "+" color. Now d' - - - 3B has "+" color and a' - - - 2A - - - 1B has "−" color. In step 614, the net numbers are not equal and the colors are opposite. The next step will be 618 to combine the two nets created. Thus, in FIG. 22, the resulting contains-list is illustrated and reflects that net 2 in cell B contains the d' - - - 3B shape and the 1B instance of net1 (denoted as +net1.A - - - 1B, where the positive sign indicates the net1.A - - - 1B is incorporated with its regular coloring). The contained-in-list in FIG. 23 shows that one instance of net1 has interactions with a higher level net, that the 1B instance of net1 is an element of net2 in cell B, and that the total number of instances of net2 is one.

Finally, FIG. 24 depicts the expanded, or flattened structure for the net that has been traced. As shown, walking and expanding net2.B yields +d+ - - - 3B and +net1.A - - - 1B. The nets themselves may also be expanded by reading the arrow as "composed of."

Turning to FIG. 25, the design layout 700 is illustrated with colored shapes. The shapes that have been colored "−" are illustrated with cross hatched lines, while the shapes colored "+" are left blank. Thus, the preferred method provides a process for assigning binary quantities to data structures stored in nested environments. The preferred method does not depend upon a particular starting place or a particular order of working on shapes.

Thus, the preferred method automatically colors VLSI design elements for the purpose of assigning binary properties to the elements. The preferred method is equally applicable to hierarchical VLSI databases with nested components and traditional flat databases. When applied the hierarchical databases, the preferred method provides element coloring with minimal data flattening required. The preferred method is not dependent upon the order upon which the elements are operated upon and has the additional advantage of being able to automatically detect conflicts that prevent the VLSI design from being optimally colored.

While the invention has been particularly shown and described with reference to a preferred exemplary embodiment thereof, it will be understood by those skilled in the art that various changes in form and details may be made therein without departing from the spirit and scope of the invention.

It is important to note that while the present invention has been described as a computer program running a net coloring method, those skilled in the art will appreciate that the mechanisms of the present invention are capable of being distributed as a program product in a variety of forms, and that the present invention applies equally regardless of the particular type of signal bearing media to actually carry out the distribution. Examples of signal bearing media include: recordable type media such as floppy disks, hard disks and CD ROMS, and transmission type media such as digital and analog communication links, including wireless communication links.

What is claimed is:

1. A program product comprising:
   (A) a binary coloring mechanism for assigning a binary property to circuit elements, the binary coloring mechanism including mechanisms for:
      a) providing a list of intrusion pairs, each of said intrusion pairs comprising a first element and a second element which intrude according to pre-defined rules;
      b) checking a net database for elements of one of said list of intrusion pairs and returning a net and a color of elements found in said net database;
      c) coloring said intrusion pair of elements such that said first element and said second element comprise opposite colors;
      d) assigning said first element and said second element to a net and adding said net to said net database; and
      e) performing steps b) through d) until all intrusion pairs in said list of intrusion pairs is operated upon; and
   (B) signal bearing media bearing the binary coloring mechanism.

2. The program product of claim 1 wherein the signal bearing media comprises recordable media.

3. The program product of claim 1 wherein the signal bearing media comprises transmission media.

4. The program product claim 1 wherein the binary coloring mechanism colors and assigns said first element and said second element to a net by coloring said first element the opposite color of said second element and assigning said first element to the net of said second element.

5. The program product claim 1 wherein the binary coloring mechanism colors and assigns said first element and said second element to a net by combining a first net containing said first element with a second net containing said second element when said intrusion pair comprises two found elements of different colors and wherein the coloring and assigning comprises reversing the color of said first net and combining said reversed first net with said second net when said intrusion pair comprises two found elements of the same color.

6. The program product claim 1 wherein said elements comprise mask shapes and wherein said color represents mask shape phase shift.

7. The program product claim 1 wherein said elements comprise a nested set of mask shapes.

8. The program product claim 1 wherein said net database comprises a contains-list, wherein said contains-list includes a list of mask shapes and other nets contained in each net in said net database.

9. The program product of claim 8 wherein said net database comprises a contained-in-list, wherein said contained-in-list includes representation of nets that are part of higher level nets.

10. The program product of claim 1 wherein the binary coloring mechanism further comprises a mechanism for generating a phase shift mask design from said net database.

11. A program product comprising:
   (A) a binary coloring mechanism for coloring a binary property and forming a nested net database of colored VLSI elements with minimal data flattening in a hierarchical CAD dataset, the binary coloring mechanism including mechanisms for:
      a) providing a nested list of intrusion pairs of elements;
      b) selecting an intrusion pair of elements from said nested list, said intrusion pair including an element instance and a second element instance;
      c) checking said nested net database of colored elements for said first element instance and said second element instance and returning a net number and a color of any found element instance;
      d) coloring said element instances in said selected intrusion pair such that said first element instance has a color opposite said second element instance and adding said first element instance to a net with said second element instance in said nested net database; and
      e) performing steps b) through d) until all intrusion pairs in said intrusion pair list are operated upon; and
   (B) signal bearing media bearing the binary coloring mechanism.

12. The program product of claim 11 wherein the signal bearing media comprises recordable media.

13. The program product of claim 11 wherein the signal bearing media comprises transmission media.

14. The program product of claim 11 wherein the binary coloring mechanism colors said element instances by:
   i) coloring said first element instance a first color and coloring said second element instance a second color and assigning said intrusion pair to a new net when said intrusion pair comprises two unfound elements;
   ii) coloring said first element instance the opposite color of said second element instance and assigning said first element instance to the net of said second element instance shape when said intrusion pair comprises an unfound element instance and a found element instance; and
   iii) combining a first net containing said first element instance with a second net containing said second element instance when said intrusion pair comprises two found element instances of different colors and comprises reversing the color of said first net and combining said reversed first net with said second net when said intrusion pair comprises two found element instances of the same color.

15. The program product of claim 11 wherein said element instances comprise mask shape instances and wherein said color comprises mask shape instance phase shift.

16. The program product of claim 11 wherein said nested net database comprises a contains-list, wherein said contains-list includes a list of shape instances and other nets contained in each net in said nested database.

17. The program product of claim 11 wherein said nested net database comprises a contained-in-list, wherein said contained-in-list includes representation of net instances that are part of higher level nets, and wherein said contained-in-list includes the number of instances of the net that could be represented at an associated node and the number of instances of the net that are represented at an associated node.

18. The program product of claim 11 wherein the binary coloring mechanism checks said nested net database for said first element instance and said second element instance by determining if the whole path to said first element instance and said second element instance is located in said nested net database.

19. The program product claim 11 wherein the binary coloring mechanism further comprises a mechanism for generating a phase shift mask design from said nested net database.

20. A program product comprising:
(A) a binary coloring mechanism for phase coloring mask shapes and forming a nested database of colored mask shapes with minimal data flattening in a hierarchical CAD dataset, the binary coloring mechanism including mechanisms for:
  a) providing a nested list of intrusion pairs of shapes;
  b) selecting an intrusion pair of shapes from said nested list, said intrusion pair including a first shape instance and a second shape instance;
  c) checking said nested database of colored shapes for said first shape instance and said second shape instance and returning a net number and a color of any found shape instance;
  d) coloring said shape instances in said selected intrusion pair and assigning said shape instances to a net in said nested database, and wherein
    i) the binary coloring mechanism colors the shape instances and assigns the shape instances to a net by coloring said first shape instance a first color and coloring said second shape instance a second color and assigning said intrusion pair to a new net when said intrusion pair comprises two unfound shapes;
    ii) the binary coloring mechanism colors the shape instances and assigns the shape instances to a net by coloring said first shape instance the opposite color of said second shape instance and assigning said first shape instance to the net of said second shape instance shape when said intrusion pair comprises an unfound shape instance and a found shape instance;
    iii) the binary coloring mechanism colors the shape instances and assigns the shape instances to a net by combining a first net containing said first shape with a second net containing said second shape when said intrusion pair comprises two found shapes of different colors and wherein the step of coloring and assigning shape instances to a net comprises reversing the color of said first net and combining said reversed first net with said second net when said intrusion pair comprises two found shapes of the same color; and
  e) performing steps b) through d) until all intrusion pairs in said intrusion pair list are operated upon;
(B) signal bearing media bearing the binary coloring mechanism.

21. The program product of claim 20 wherein the signal bearing media comprises recordable media.

22. The program product of claim 20 wherein the signal bearing media comprises transmission media.

23. The program product of claim 20 wherein said nested database comprises a contains-list, wherein said contains-list includes a list of shape instances and other nets contained in each net in said nested database and wherein the step of coloring said shape instances in said selected intrusion pair and assigning said shape instances to a net in said nested database comprises updating said contains-list.

24. The program product of claim 20 wherein said nested database comprises a contained-in-list, wherein said contained-in-list includes representation of net instances that are part of higher level nets, and wherein said contained-in-list includes the number of instances of the net that could be represented at an associated node and the number of instances of the net that are represented at an associated node and wherein the step of coloring said shape instances in said selected intrusion pair and assigning said shape instances to a net in said nested database comprises updating said contained-in-list.

25. The program product of claim 20 wherein the binary coloring mechanism checks said nested database of colored shapes for said first shape instance and said second shape instance by determining if the whole path to said first shape instance and said second shape instance is located in said nested database.

26. The program product of claim 20 where the binary coloring mechanism further comprises a mechanism for generating a phase shifted mask from said nested database.

* * * * *